(12) United States Patent
Kurihara et al.

(10) Patent No.: US 6,266,284 B1
(45) Date of Patent: Jul. 24, 2001

(54) OUTPUT BUFFER FOR EXTERNAL VOLTAGE

(75) Inventors: Kazuhiro Kurihara, Sunnyvale; Tien-Min Chen, San Jose, both of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/661,356

(22) Filed: Sep. 14, 2000

Related U.S. Application Data
(60) Provisional application No. 60/199,544, filed on Apr. 25, 2000.

(51) Int. Cl.[7] .................................................. G11C 7/00
(52) U.S. Cl. ............................ 365/189.05; 365/189.11
(58) Field of Search .......................... 365/189.05, 189.11, 365/185.23; 327/108, 112

(56) References Cited

U.S. PATENT DOCUMENTS

| | | | |
|---|---|---|---|
| 5,311,076 | 5/1994 | Park et al. ............................ | 307/443 |
| 5,420,525 | 5/1995 | Maloberti et al. ..................... | 326/27 |
| 5,469,385 | * 11/1995 | Smith et al. ..................... | 365/189.05 |
| 5,557,229 | 9/1996 | Eitan ..................................... | 327/374 |
| 5,798,972 | * 8/1998 | Lao et al. ......................... | 365/189.05 |
| 5,841,702 | * 11/1998 | Kim ................................. | 365/189.05 |
| 5,949,721 | * 9/1999 | Vwon et al. ..................... | 365/189.05 |
| 5,966,026 | 10/1999 | Partovi et al. .......................... | 326/27 |
| 6,052,317 | * 4/2000 | Miura ............................... | 365/189.05 |

* cited by examiner

Primary Examiner—Tan T. Nguyen
(74) Attorney, Agent, or Firm—Wagner, Murabito & Hao LLP

(57) ABSTRACT

A memory device is disclosed that is operated with a supply voltage (Vcc) and includes an output buffer circuit and an output buffer driver circuit. The output buffer circuit buffers data that is read out of the memory device and controls the output buffer driver circuit to generate data output signals using an external supply voltage (VccQ). The output buffer circuit controls the output buffer driver circuit with output signals generated with the supply voltage (Vcc) and an external supply voltage (VccQ). The output buffer driver circuit includes a p-channel pull-up transistor and an n-channel pull-down transistor that can be completely activated and deactivated by the output buffer circuit with the supply voltage (Vcc) and the external supply voltage (VccQ). In addition, the output buffer circuit controls the output buffer driver circuit to minimize noise on the data output signals

22 Claims, 4 Drawing Sheets

OUTPUT BUFFER FOR EXTERNAL VOLTAGE

This application claims the benefit under 35 U.S.C. §119(e) of Provisional U.S. patent application Serial No. 60/199,544, filed on Apr. 25, 2000.

FIELD OF THE INVENTION

The present invention relates generally to non-volatile memory devices and, more particularly, to methods and systems for buffering electric signals to generate output signals with an external voltage in a flash electrically erasable programmable memory ("EEPROM").

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. Some applications require retention of the instructions and/or data in a permanent or non-volatile storage medium. Such memories maintain information when the device is turned off or power is removed. Exemplary applications include computer Basic Input Output Systems (BIOS) storage and diskless handheld computing devices, such as personal digital assistants.

Flash memories store information in the absence of continuous power and are capable of being constructed in a very compact form. Flash memory is typically constructed by fabricating a plurality of floating gate transistors in a silicon substrate to form a core cell area. A floating gate transistor is capable of storing electrical charge on a separate gate electrode, known as a floating gate, that is separated by a dielectric layer from a control gate electrode. Generally, stored electrical charge in the floating gate represents a data state.

Flash memory devices also include a periphery area in the silicon substrate. Logic and addressing functions are performed by a plurality of logic and addressing circuits in the periphery area. The logic and addressing circuits perform internal logic operations such as reading, programming and erasing the stored charge in the floating gate transistors.

Flash memory devices also use a supply voltage (Vcc). The supply voltage (Vcc) is a fixed voltage power supply that is used to power the internal logic operations.

The flash memory is electrically interfaced with a system processor of an electronic system or device. To obtain data, the system processor directs the flash memory to perform a read operation. The flash memory operates the logic and addressing circuits to read the floating gate transistors and provides a plurality of outputs indicating whether the floating gate transistors are programmed or un-programmed (i.e. charge stored or not stored).

In general, an output buffer driver within the flash memory receives data signals read out from the flash memory and subsequently outputs data for use by the electronic system or device. Such an output buffer driver generally includes an output or final stage comprised of large-sized MOS transistors. Typically, the MOS transistors include a p-channel pull-up transistor and an n-channel pull-down transistor that cooperatively function to maintain the voltage level of the data output signal. The pull-up and pull-down transistors allow the output to be switched between logic high (logic "1") and logic low (logic "0") levels at high speed. The pull-up and pull-down transistors are controlled by electric signals at their respective control gates that are, in general, generated by the flash memory based on the status of the stored data currently being read.

The data outputs signals from the output buffer driver can be generated with the supply voltage (Vcc) or with a voltage source of a different magnitude, such as a supply voltage (VccQ). A problem occurs when the output buffer driver generates the data output signals with supply voltages that are greater than the supply voltage (Vcc). Under these conditions, the p-channel pull-up transistor may not be capable of being fully turned off due to the supply voltage at the source of the p-channel pull-up transistor being higher than a logic high electric signal generated by the flash memory with the supply voltage (Vcc). When the data output signals from the output buffer driver are switched from logic high to logic low, the data output signals will supply undesirable current as well suffer from slow switching time due to the continued partial activation of the p-channel pull-up transistor.

SUMMARY

The presently preferred embodiments include a flash memory that is capable of turning off completely a p-channel pull up transistor in an output buffer driver circuit without regard to the magnitude of the voltage source used to generate data output signals. The voltage level at the source of the p-channel pull-up transistor is about equal to an external supply voltage (VccQ). The flash memory operates with both a supply voltage (Vcc) and the external supply voltage (VccQ) to generate output signals that fully control the output buffer driver circuit. The p-channel pull-up transistor is completely deactivated when the voltage level of the electric signal applied to the control gate of the p-channel pull-up transistor is about equal to the external supply voltage (VccQ). Accordingly, the flash memory can be interfaced with electronic systems operated with an external supply voltage (VccQ) that is greater than the supply voltage (Vcc) that operates the flash memory.

The present invention discloses a memory device that is operated with a supply voltage (Vcc). The preferred memory device is a flash memory. The flash memory includes an output buffer circuit electrically connected with an output buffer driver circuit. The output buffer driver circuit is supplied an external supply voltage (VccQ). The output buffer driver circuit generates a data output signal on a data output line in response to the output buffer circuit.

The output buffer circuit includes a p-channel pull-up circuit, an n-channel pull-up circuit and a pull-down circuit to control the output buffer driver circuit. The p-channel pull-up circuit includes an activation circuit that is supplied the external supply voltage (VccQ) for generating a feedback signal when directed by the electric signals. The p-channel pull-up circuit also includes a driver circuit electrically connected with the activation circuit and the n-channel pull-up circuit that is also supplied the external supply voltage (VccQ). During operation of the flash memory, the driver circuit is responsive to the electric signals and the feedback signal to generating an output signal that is referred to as a third output signal. The third output signal controls the p-channel pull-up transistor in the output buffer driver circuit such that the p-channel pull-up transistor can be completely deactivated.

The n-channel pull-up circuit is electrically connected with the p-channel pull-up circuit and generates an output signal, which is referred to as a second output signal, when directed by the p-channel pull-up circuit. The second output signal controls the output buffer driver circuit to gene rate the data output signal. The pull-down circuit generates an output signal, which is referred to as a first output signal, when directed by the electric signals generated by the flash memory. The first output signal controls an n-channel pull-down transistor within the output buffer driver circuit.

Another preferred embodiment discloses a method of controlling generation of an output signal with an external supply voltage (VccQ) using a voltage buffer circuit in a memory device. The method comprises the steps of providing a supply voltage (Vcc) that is used by the memory device to generate electric signals. The voltage buffer circuit generates a feedback signal in response to the electric signals using the external supply voltage (VccQ). The voltage buffer circuit is responsive to the feedback signal and the electric signals to generate the output signal using the external supply voltage (VccQ).

These and other features and advantages will become apparent upon consideration of the following detailed description of the presently preferred embodiments, viewed in conjunction with the appended drawings.

DETAILED DESCRIPTION OF THE PRESENTLY PREFERRED EMBODIMENTS

Figure 1:
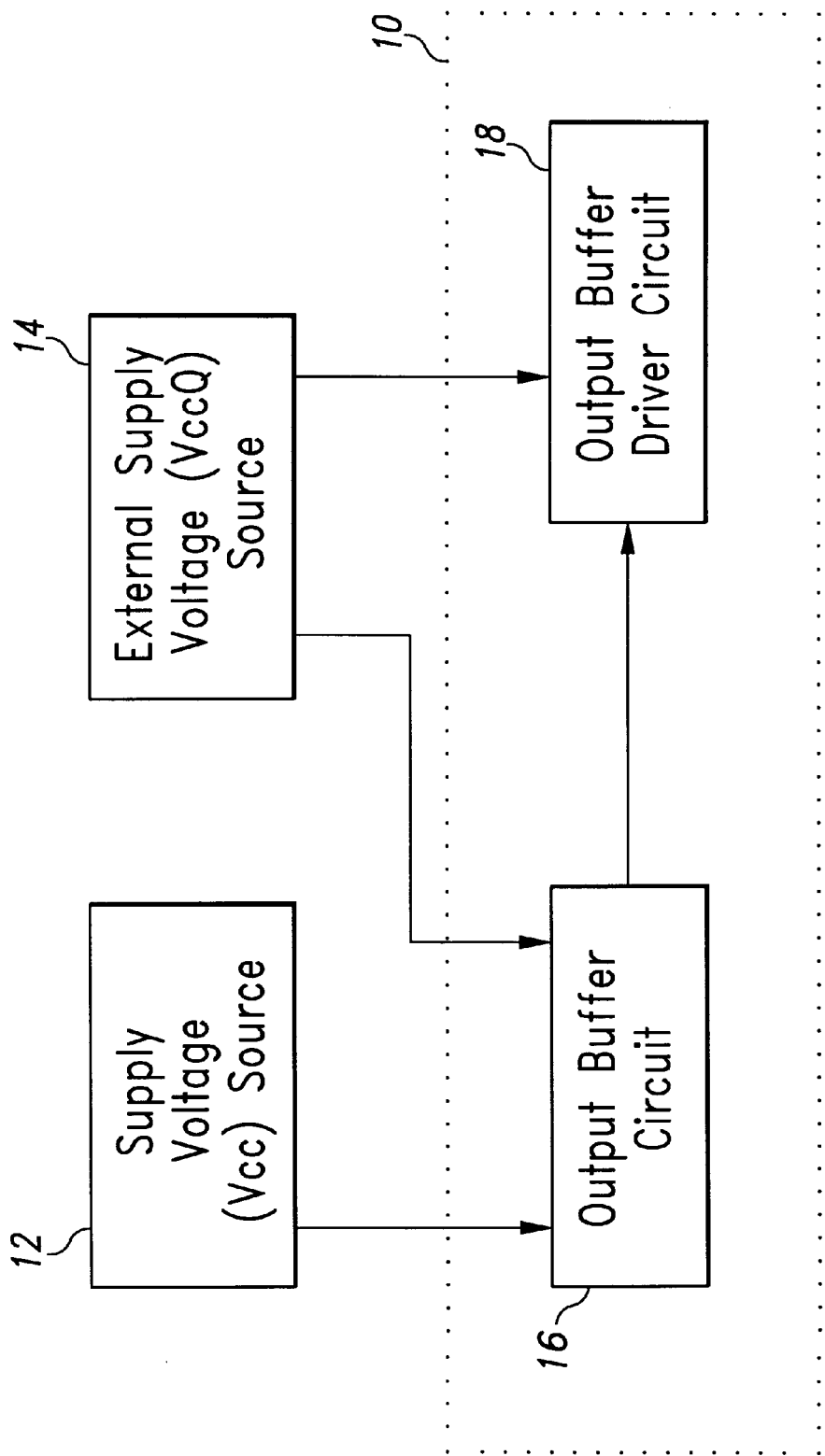
FIG. 1 is a block diagram of a portion of a flash memory constructed in accordance with the present invention.

FIG. 1 illustrates a portion of a flash memory 10, a supply voltage (Vcc) source 12 and an external supply voltage (VccQ) source 14. The preferred flash memory 10 includes an output buffer circuit 16 that is electrically connected with an output buffer driver circuit 18. The output buffer circuit 16 is electrically connected with the supply voltage (Vcc) source 12 and the external supply voltage (VccQ) source 14. The external supply voltage (VccQ) source 14 is also electrically connected with the output buffer driver circuit 18.

The supply voltage (Vcc) source 12 and the external supply voltage (VccQ) source 14 could be formed from a variety of readily available, widely known power supplies or similar power sources. The supply voltage (Vcc) source 12 and the external supply voltage (VccQ) source 14 supply a supply voltage (Vcc) and an external supply voltage (VccQ), respectively. In the presently preferred embodiment, the supply voltage (Vcc) source 12 is an unregulated fixed power supply that supplies the supply voltage (Vcc) in a range of about 2.7 to 3.6 V. The external supply voltage (VccQ) source 14 supplies the external supply voltage (VccQ) at whatever voltage level is desired. In the presently preferred embodiments, the external supply voltage (VccQ) is in a range of about 1.8V–5.5V. In general, the presently preferred flash memory 10 is operated with the supply voltage (Vcc). However, the output buffer circuit 16 and the output buffer driver circuit 18 are operated with both the supply voltage (Vcc) and the external supply voltage (VccQ).

The output buffer driver circuit 18 generates a data output signal. The output buffer driver circuit 18 switches the data output signal between a logic low (logic "0") state and a logic high (logic "1") state. The switching speed of the data output signal between the logic low and the logic high states is controlled to reduce switching noise on the data output signal. The data output signal drives capacitive loads at voltage levels that are about equal to zero volts (i.e. logic low) or the external supply voltage (VccQ) (i.e. logic high). Operation of the output buffer driver circuit 18 is controlled by the output buffer circuit 16 based on electric signals received from the flash memory 10 by the output buffer circuit 16.

The output buffer circuit 16 buffers electric signals generated by the flash memory 10. In the presently preferred embodiments, the electric signals are predetermined but, for example, could also be adaptive. The electric signals are generated by the flash memory 10 using the supply voltage (Vcc). The electric signals include a signal representing data read out of the flash memory 10. An electric signal that is conducting at a voltage level that is about equal to the supply voltage (Vcc) represents a logic high state, and a non-conducting electrical signal (i.e. zero volts) represents a logic low state.

The presently preferred embodiments of the output buffer circuit 16 are capable of generating output signals to control the output buffer driver circuit 18. The output signals are logic high at the voltage level of the supply voltage (Vcc) or at the voltage level of the external supply voltage (VccQ). The output buffer driver circuit 18 is thereby controlled with electric signals at voltage levels that are appropriate to completely activate and deactivate portions of the output buffer driver circuit 18. The presently preferred output buffer circuit 16 also controls the output buffer driver circuit 18 to maintain acceptable levels of switching noise. Switching noise is controlled by controlling the current supplied to the capacitive loads by the output buffer driver circuit 18. High speed switching of capacitive loads generates inductive overvoltage (switching noise) that can be reduced by minimizing abrupt changes in current flow. The output buffer circuit 16 is capable of controlling the supply voltage (Vcc) and the external supply voltage (VccQ) to control the current supplied by the output buffer driver circuit 18 to the capacitive loads.

Figure 2:
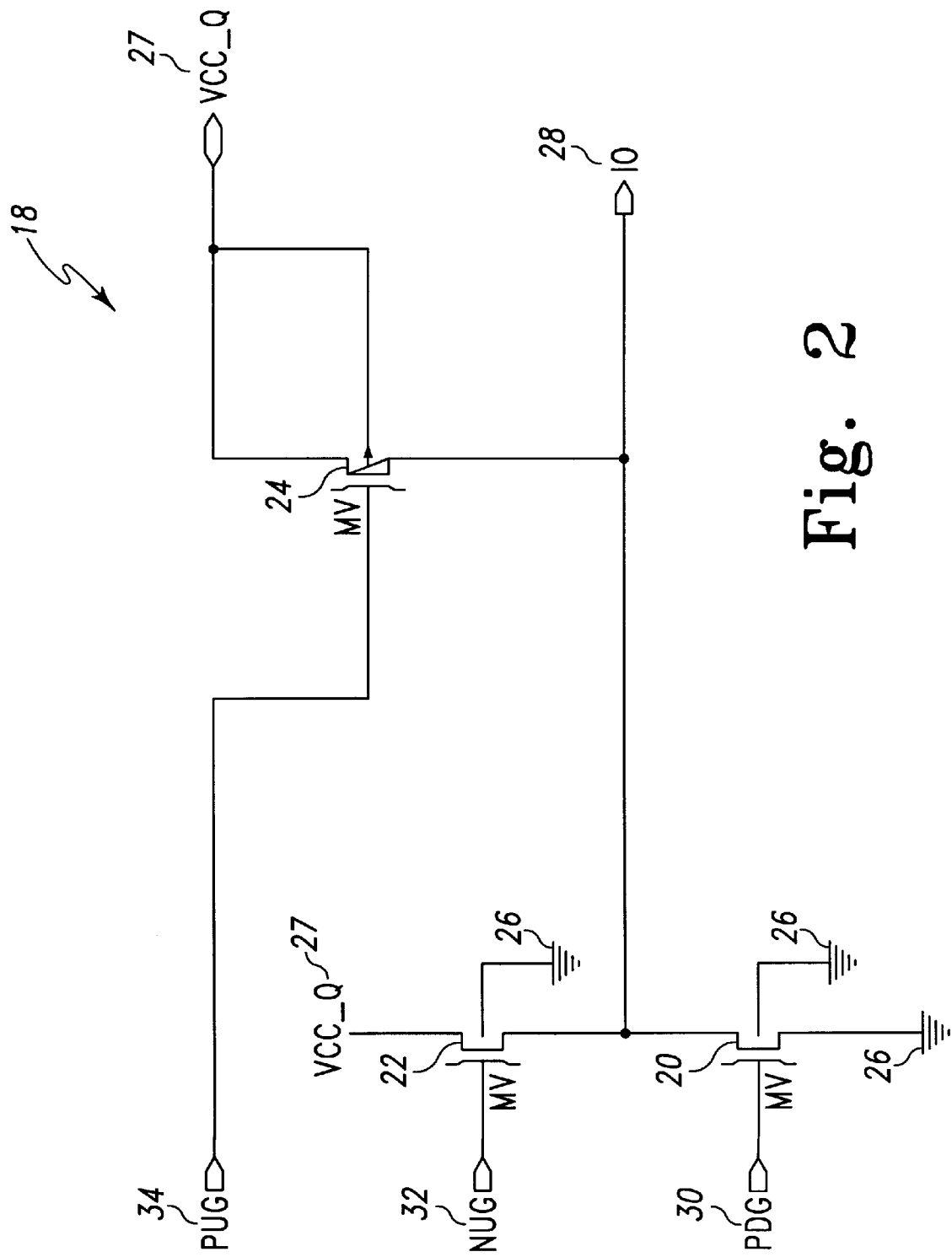
FIG. 2 is a circuit schematic of one preferred embodiment of an output buffer driver circuit illustrated in FIG. 1.

FIG. 2 illustrates a circuit schematic of the presently preferred output buffer driver circuit 18. The output buffer driver circuit 18 includes an n-channel pull-down transistor 20, an n-channel pull-up transistor 22 and a p-channel pull-up transistor 24 electrically connected as illustrated. The output buffer driver circuit 18 is also electrically connected with a ground connection 26 and the external supply voltage (VccQ) source 14 by an external supply voltage (VccQ) line 27. The wells of n-channel transistors 20, 22 and p-channel pull-up transistor 24 are electrically connected with the ground connection 26 and the external supply voltage (VccQ) line 27, respectively, to avoid forward bias conditions during operation. Forward bias conditions can activate diodes within the transistors such that a leakage current can occur that may compromise reliable operation.

The output buffer driver circuit 18 is controlled by the output buffer circuit 16 to switch the voltage level of the data output signal on a data output line (IO) 28. The voltage level of the data output signal is controlled with n-channel pull-down transistor 20, n-channel pull-up transistor 22 and p-channel pull-up transistor 24. N-channel pull-down transistor 20 is activated to pull down the voltage level of the data output signal to the logic low state of about zero volts. When activated, n-channel pull-down transistor 20 electrically connects the data output line (IO) 28 with the ground connection 26.

The voltage level of the data output signal is switched from about zero volts to a logic high state that is about equal to the external supply voltage (VccQ) when n-channel pull-up transistor 22 is activated. Activation of n-channel pull-up transistor 22 electrically connects the data output line (IO) 28 to the external supply voltage (VccQ) on the external supply voltage (VccQ) line 27. P-channel pull-up transistor 24 is also activated to more quickly pull up the data output signal from the logic low state to the logic high state. When activated, p-channel pull-up transistor 24 electrically connects the external supply voltage (VccQ) line 27 with the data output line (IO) 28.

Control of n-channel pull-down transistor 20, n-channel pull-up transistor 22 and p-channel pull-up transistor 24 are by electric signals on a pull-down line (PDG) 30, an n-channel pull-up line (NUG) 32 and a p-clhannel pull-up line (PUG) 34, respectively, that are electrically connected to the respective control gates as illustrated. Although not illustrated in FIG. 2, the pull-down line (PDG) 30, the n-channel pull-up line (NUG) 32 and the p-channel pull-up line (PUG) 34 are electrically connected with the output buffer circuit 16. The voltage level of the electric signal that completely activates n-channel pull-down transistor 20 and n-channel pull-up transistor 22 is about equal to the supply voltage (Vcc). On the other hand, the voltage level of the electric signal that completely deactivates p-channel pull-up transistor 24 is about equal to the external supply voltage (VccQ).

When p-channel pull-up transistor 24 is supplied the external supply voltage (VccQ) at its control gate and at its source, it is completely deactivated. Complete deactivation of p-channel pull-up transistor 24 eliminates leakage current that undesirably increases the current on the data output line (IO) 28, as well as undesirably affects the switching of the data output signal. In the presently preferred embodiment, the output buffer circuit 16 operates with both the supply voltage (Vcc) and the external supply voltage (VccQ) to filly control the p-channel pull-up transistor 24.

Figure 3:
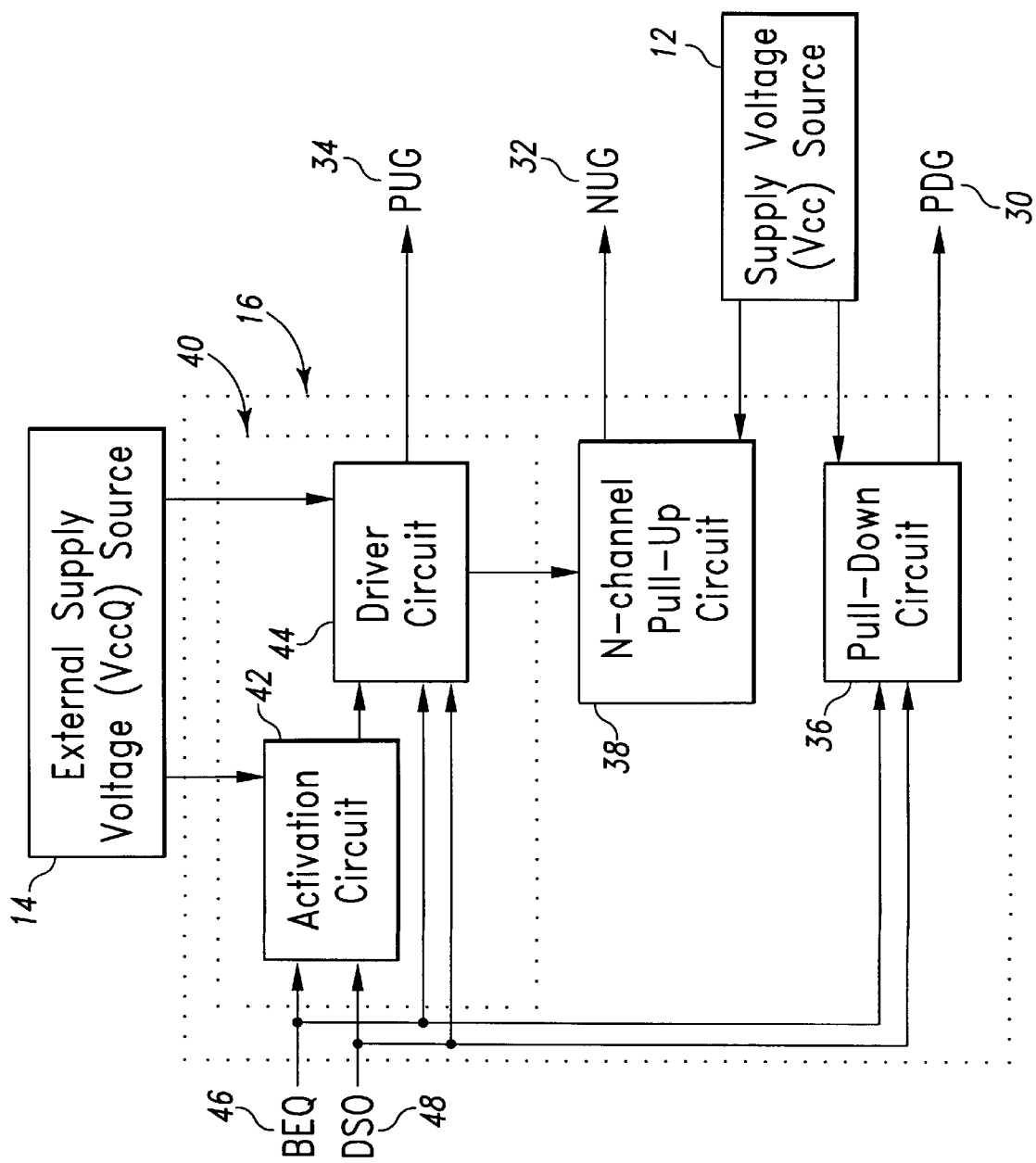
FIG. 3 is an expanded block diagram of one preferred embodiment of an output buffer circuit illustrated in FIG. 1.

FIG. 3 illustrates an expanded block diagram of the presently preferred output buffer circuit 16, the supply voltage (Vcc) source 12 and the external supply voltage (VccQ) source 14. The output buffer circuit 16 includes a pull-down circuit 36, an n-channel pull-up circuit 38 and a p-channel pull-up circuit 40 that are electrically connected as illustrated. The p-channel pull-up circuit 40 includes an activation circuit 42 that is electrically connected with a driver circuit 44. Both the activation circuit 42 and the driver circuit 44 are electrically connected with the external supply voltage (VccQ) source 14. In addition, the supply voltage (Vcc) source 12 is electrically connected with pull-down circuit 36 and the n-channel pull-up circuit 38.

The output buffer circuit 16 receives electric signals from the flash memory 10 on a buffer enable line (BEQ) 46 and a data signal line (DSO) 48. The buffer enable line (BEQ) 46 and the data signal line (DSO) 48 are electrically connected with the pull-down circuit 36, the activation circuit 42 and the driver circuit 44. The electric signal present on the buffer enable line (BEQ) 46 is an enable signal to enable and disable the output buffer circuit 16. The electric signal on the data signal line (DSO) 48 is a data signal that represents the data read out of the flash memory 10. Generation of the enable signal and the data signal by the flash memory 10 occurs when data is read out of the flash memory 10. The pull-down circuit 36, the n-channel pull-up circuit 38 and the driver circuit 44 are electrically connected with the output buffer driver circuit 18 by the pull-down line (PDG) 30, the n-channel pull-up line (NUG) 32 and the p-channel pull-up line (PUG) 34, respectively.

Output signals from the output buffer circuit 16 control the output buffer driver circuit 18. The pull-down circuit 36 generates a first output signal on the pull-down line (PDG) 30. The first output signal is directed to the output buffer driver circuit 18 to control n-channel pull-down transistor 20 illustrated in FIG. 2. The n-channel pull-up circuit 38 is activated by the driver circuit 44 generates a second output on the n-channel pull-up line (NUG) 32 to control n-channel pull-up transistor 22 illustrated in FIG. 2. The p-channel pull-up circuit 40 similarly generates and directs a third output signal from the driver circuit 44 on the p-channel pull-up line (PUG) 34 to control p-channel pull-up transistor 24 illustrated in FIG. 2.

Figure 4:
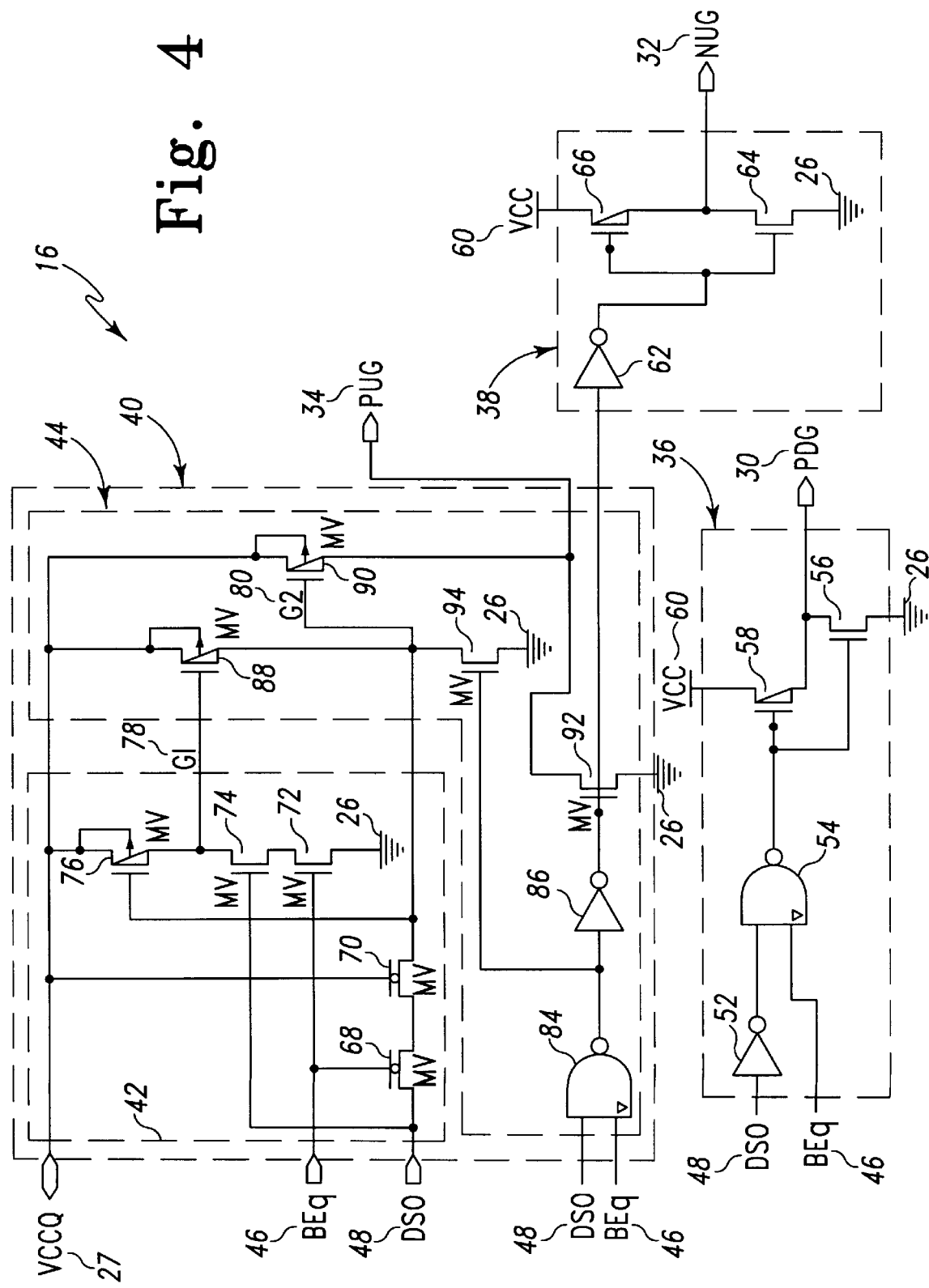
FIG. 4 is a circuit schematic of one preferred embodiment of an output buffer circuit illustrated in FIG. 3.

FIG. 4 is a circuit schematic of the presently preferred output buffer circuit 16. The pull-down circuit 36 includes an inverter 52, a NAND gate 54, an n-channel transistor 56 and a p-channel transistor 58 that are electrically connected as illustrated. The pull-down circuit 36 is also electrically connected with the ground connection 26 and the supply voltage (Vcc) source 12 by a supply voltage (Vcc) line 60. When activated by the enable and data signals, the NAND gate 54 activates either n-channel transistor 56 or p-channel transistor 58 to generate the first output signal on the pull-down line (PDG) 30. The voltage level of the first output signal will be either zero volts, when logic low, or about equal to the supply voltage (Vcc), when logic high.

When p-channel transistor 58 is activated by a non-conducting (logic "0") electric signal the first output signal rises to the supply voltage (Vcc). The rise of the voltage level of the first output signal is controlled to minimize switching noise created by activation of n-channel pull-down transistor 20 illustrated in FIG. 2. Switching noise on the data output signal disrupts operation of a sensing amplifier that senses the data state of the core cells when data is read out of the flash memory 10. The switching noise is a problem when n-channel pull-down transistor 20 is activated quickly to electrically connect the ground connection 26 with the data output line (IO) 28 illustrated in FIG. 2.

Controlling the voltage level supplied to the control gate of n-channel pull-down transistor 20 allows the switching noise to be minimized. The first output signal is generated with a voltage level that increases slowly to allow the change in current flow through n-channel pull-down transistor 20 to be less abrupt. "Slowly" is determined by testing to identify the rate of increase that minimizes switching noise and still provides acceptable speed of activation of n-channel pull-down transistor 20. The voltage level is increased slowly by forming p-channel transistor 58 to be a weak transistor with a relatively high predetermined resistance. As such, when p-channel transistor 58 is activated, the voltage level of the pull-down line (PDG) 30 is raised slowly to the supply voltage (Vcc). Although p-channel transistor 58 is illustrated in FIG. 4 as a single transistor, multiple parallel transistors, for example, could be used. The optimal rate of increase of the first output signal to minimize switching noise during the activation of n-channel pull-down transistor 20 but maintain switching speed requirements can be achieved through selective use of the multiple parallel transistors.

The presently preferred n-channel pull-up circuit 38 includes an inverter 62, an n-channel transistor 64 and a p-channel transistor 66 that are electrically connected as illustrated in FIG. 4. The n-channel pull-up circuit 38 is also electrically connected to the supply voltage (Vcc) line 60, the ground connection 26 and the p-channel pull-up circuit 40. The n-channel pull-up circuit 38 is directed by the p-channel pull-up circuit 40 to generate the second output signal on the data output line (NUG) 32 with n-channel transistor 64 or p-channel transistor 66.

The voltage levels of the second output signal are similar to the first output signal previously set forth. In addition, similar to p-channel transistor 58 of the pull-down circuit 36, p-channel transistor 66 controls the activation of n-channel pull-up transistor 22, illustrated in FIG. 2, to minimize switching noise. Switching noise is a problem when n-channel pull-up transistor 22 is activated quickly to electrically connect the external supply voltage (VccQ) line 27 with the data output line (IO) 28 illustrated in FIG. 2. In the presently preferred embodiment, p-channel transistor 66 is one or more weak transistors that raise the voltage level of the second output signal to the supply voltage (Vcc) slowly. Controlling the voltage level activates n-channel pull-up transistor 22 slowly to avoiding abrupt changes in the current flow through n-channel pull-up transistor 22 thereby minimizing switching noise on the data output signal. Slowly is determined by testing to identify the rate of increase that minimizes switching noise and still provides acceptable speed of activation of n-channel pull-up transistor 22.

In another presently preferred embodiment, the n-channel pull-up circuit 38 includes a NAND gate (not shown) instead of the inverter 62. The NAND gate receives the enable signal and the data signal from the flash memory 10 to direct the generation of the second output signal on the n-channel pull-up line (NUG) 32.

Referring again to FIG. 4, the presently preferred p-channel pull-up circuit 40 includes the activation circuit 42 and the driver circuit 44 as previously set forth. The presently preferred activation circuit 42 includes a plurality of low threshold n-channel transistors 68, 70, a plurality of n-channel transistors 72, 74 and a p-channel transistor 76 that are electrically connected as illustrated. The activation circuit 42 is also electrically connected with the external supply voltage (VccQ) line 27 and the ground connection 26. The activation circuit 42 is directed by the enable signal and the data signal to generate a feedback signal on a first node (G1) 78.

N-channel transistors 72, 74 and p-channel transistor 76 control the voltage level of feedback signal on the first node (G1) 78. The first node (G1) 78 is electrically connected with the drains of n-channel transistor 74 and p-channel transistor 76 as illustrated in FIG. 4. When n-channel transistors 72 and 74 are activated, the first node (G1) 78 is electrically connected with the ground connection 26, and the voltage level of the first node (G1) 78 is about equal to zero volts. N-channel transistors 72, 74 are controlled by the electric signals on the buffer enable line (BEQ) 46 and the data signal line (DSO) 48, respectively. N-channel transistors 72, 74 are activated when the respective enable signal and the data signal that are received at their respective control gates are conducting (logic "1").

The voltage level of the first node (G1) 78 is about equal to the external supply voltage (VccQ) when either n-channel transistors 72 or 74 are deactivated and p-channel transistor 76 is activated. The external supply voltage (VccQ) line 27 is electrically connected to the source of p-channel transistor 76, as illustrated in FIG. 4. Activation of p-channel transistor 76 passes the external supply voltage (VccQ) to the first node (G1) 78. The well of p-channel transistor 76 is electrically connected to the external supply voltage (VccQ) line 27 to avoid forward bias conditions during operation.

The activation of p-channel transistor 76 is controlled by the voltage levels on the second node (G2) 80 that is electrically connected with the control gate of p-channel transistor 76. The voltage levels on the second node (G2) 80 can be about zero volts or about equal to the external supply voltage (VccQ). Control of the voltage levels of the second node (G2) 80 is by the driver circuit 44 discussed later. However, the activation circuit 42 is electrically connected with the second node (G2) 80 by low threshold n-channel transistors 68, 70. Low threshold n-channel transistors 68, 70 are controlled by the external supply voltage (VccQ) on the external supply voltage (VccQ) line 27, and the enable signal on the buffer enable line (BEQ) 46, respectively.

The presently preferred low threshold n-channel transistors 68 and 70 provide separation of the supply voltage (Vcc) and the external supply voltage (VccQ). N-channel transistor 68 does not allow the external supply voltage (VccQ) present on the second node (G2) 80 to be supplied to the data signal line (DSO) 48 when the voltage level of external supply voltage (VccQ) is greater than the supply voltage (Vcc). Conversely, low-threshold n-channel transistor 70 does not allow the supply voltage (Vcc) to be supplied to the external supply voltage (VccQ) on the second node (G2) 80 when the voltage level of the supply voltage (Vcc) is higher than the external supply voltage (VccQ). Accordingly, the activation circuit 42 affects the voltage level of the second node (G2) 80 only when the data signal is non-conducting (logic "0"). The non-conducting data signal provides a relatively weak pull-down of the voltage level on the second node (G2) 80 due to the relatively high resistance of the low threshold n-channel transistors 68,70.

N-channel transistors 72, 74 and p-channel transistor 76 are electrically connected to form an inverter. As such, a conducting (logic "1") data signal on the control gates of n-channel transistor 74 and p-channel transistor 76 generate a non-conducting (logic "0") feedback signal on the first node (G1) 78. P-channel transistor 76 is completely deactivated when the voltage level of the signal at the control gate of p-channel transistor 76 is equal to the magnitude of the external supply voltage (VccQ) at the source of p-channel transistor 76. The driver circuit 44 raises the voltage level of the second node (G2) 80 to the external supply voltage (VccQ).

Referring again to FIG. 4, the presently preferred driver circuit 44 includes a NAND gate 84, an inverter 86, a plurality of p-channel transistors 88, 90 and a plurality of n-channel transistors 92, 94 that are electrically connected as illustrated. The driver circuit 44 is also electrically connected with the ground connection 26, the external supply voltage (VccQ) line 27, the n-channel pull-up circuit 38 and the activation circuit 42. The activation circuit 42 and the enable and data signals from the flash memory 10 direct the driver circuit 44 to generate the third output signal on the p-channel pull-up line (PUG) 34.

The driver circuit 44 is controlled by both the feedback signal from the activation circuit 42, and the electric signals from the flash memory 10 to generate the third output signal with the external supply voltage (VccQ). The external supply voltage (VccQ) line 27 is electrically connected with the source of p-channel transistors 88, 90 as illustrated in FIG. 4. The well of p-channel transistors 88, 90 are also electrically connected to the external supply voltage (VccQ) line 27 to avoid forward bias conditions during operation. The control gate of p-channel transistor 88 is electrically connected to the first node (G1) 78. As such, p-channel transistor 88 is controlled by the voltage levels of the feedback signal supplied on the first node (G1) 78 by the activation circuit 42. The drain of p-channel transistor 88 is electrically connected with the second node (G2) 80, the control gate of p-channel transistor 90 and the drain n-channel transistor 94 as illustrated.

The voltage level that is present on the second node (G2) 80 is controlled by p-channel transistor 88 and n-channel transistor 94. Activation of p-channel transistor 88 by the feedback signal raises the second node (G2) 80 to the voltage level of the external supply voltage (VccQ). Conversely, when activated, n-channel transistor 94 lowers the voltage level of the second node (G2) 80 to about zero volts by electrically connecting the second node (G2) 80 with the ground connection 26.

P-channel transistor 90 controls the supply of the external supply voltage (VccQ) to the p-channel pull-up line (PUG) 34. The voltage level of the p-channel pull-up line (PUG) 34 is also controlled by n-channel transistor 92. When activated, n-channel transistor 92 electrically connects the p-channel pull-up line (PUG) 34 to the ground connection 26, thereby lowering the voltage level to about zero volts. Similar to p-channel transistor 58 of the pull-down circuit 36, n-channel transistor 92 is one or more weak transistors that control the activation of p-channel pull-up transistor 24, illustrated in FIG. 2, to minimize switching noise. Switching noise is a problem when p-channel pull-up transistor 24 is activated quickly to electrically connect the external supply voltage (VccQ) line 27 with the data output line (IO) 28 illustrated in FIG. 2. In the presently preferred embodiment, the control gate of p-channel pull-up transistor 24 is controlled by slowly lowering the voltage level of the third output signal to the logic low state using n-channel transistor 92. "Slowly" is determined by testing to identify the rate of increase that minimizes switching noise and still provides acceptable speed of activation of p-channel pull-up transistor 24.

N-channel transistors 92, 94 are controlled by the inverter 86 and NAND gate 84, respectively. NAND gate 84 responds to the enable signal and the data signal that are respectively supplied on the enable line (BEQ) 46 and the data line (DSO) 48 by the flash memory 10. The electrical connection of p-channel transistors 88, 90, n-channel transistors 92, 94 and inverter 86 form a level shifter. The level shifter can be, for example, a noninverting or an inverting level shifter.

Level shifters transfer a voltage when activated by an electric signal. In the presently preferred embodiment, the non-inverting level shifter formed with the driver circuit 44 transfers the external supply voltage (VccQ) to the p-channel pull-up line (PUG) 34 when a conducting (logic "1") electric signal is generated by the NAND gate 84. When the NAND gate 84 generates a non-conducting (logic "0") electric signal, the p-channel pull-up line (PUG) 34 is electrically connected with the ground connection 26.

It should be recognized that the driver circuit 44 is not a "true" level shifter. If the driver circuit 44 was "true" level shifter, the feedback signal that controls p-channel transistor 88 would be the third output signal on the p-channel pull-up line (PUG) 34. In the presently preferred embodiment, the feedback signal that controls p-channel transistor 88 is supplied by the activation circuit 42, as previously set forth. The feedback signal is supplied by the activation circuit 42 to avoid a feedback signal that is raised slowly to a logic high state.

The operation of the presently preferred embodiment will now be explained for the case when the external supply voltage (VccQ) is greater than the supply voltage (Vcc). Referring again to FIG. 1, during operation, the output buffer circuit 16 is directed by electric signals to control the output buffer driver circuit 18 when data is read out of the flash memory 10. When the flash memory 10 is read and the data output signal from the output buffer driver circuit 18 should be a logic low state, for example, the output buffer driver circuit 18 is directed by the output buffer circuit 16 to generate the data output signal at a voltage level that is about equal to zero volts.

Referring again to FIG. 3, when data is read out of the flash memory 10 that is a logic low state, a conducting (logic "1") enable signal is generated on the buffer enable line (BEQ) 46 and a non-conducting (logic "0") data signal is generated on the data line (DSO) 48. The voltage level of the enable signal and the data signal is about equal to the supply voltage (Vcc) and zero volts, respectively. The enable and data signals activate the pull-down circuit 36, the n-channel pull-up circuit 38 and the p-channel pull-up circuit 40 to direct the output buffer driver circuit 18.

Referring again to FIG. 4, the enable and data signals generate a non-conducting electric signal (logic "0") in the pull-down circuit 36. The non-conducting electric signal is directed to the control gates of n-channel transistor 56 and p-channel transistor 58. P-channel transistor 58 is thereby activated to pass the supply voltage (Vcc) to the pull-down line (PDG) 30. The first output signal on the pull-down line (PDG) 30 is raised slowly to the supply voltage (Vcc) by p-channel transistor 58. N-channel pull-down transistor 20, illustrated in FIG. 2, is activated to control the current on the data output line (IO) 28 by controlled electrical connection with the ground connection 26.

The conducting enable signal and the non-conducting data signal also activate the activation circuit 42 and the driver circuit 44. The activation circuit 42 is activated to raise the voltage level of the feedback signal on the first node (G1) 78 to be about equal to the external supply voltage (VccQ) by activation of p-channel transistor 76. Activation of low-threshold n-channel transistors 68 and 70 by the enable signal and the external supply voltage (VccQ), respectively, pull down the voltage level on the second node (G2) 80 with the non-conducting data signal. The data signal and the n-channel transistor 94 of the driver circuit 44 both operate to quickly lower the voltage level of the second node (G2) 80 to about zero volts.

N-channel transistor 94, of the driver circuit 44, is activated by the conducting enable signal and the non-conducting data signal to electrically connect the second node (G2) 80 with the ground connection 26. Similarly, n-channel transistor 92 is deactivated by a non-conducting electric signal from the inverter 86. Since the voltage level of the second node (G2) 80 is about equal to zero volts, p-channel transistor 90 is activated to pass the external supply voltage (VccQ) to the p-channel pull-up line (PUG) 34 as the third output signal.

Referring again to FIG. 2, p-channel pull-up transistor 24 is deactivated by the third output signal on the p-channel pull-up line (PUG) 34. P-channel pull-up transistor 24, is completely deactivated since the third output signal is about equal to the external supply voltage (VccQ). If the third output signal supplied to the control gate of p-channel pull-up transistor 24 had a voltage level that was about equal to the supply voltage (Vcc), or less, the external supply voltage (VccQ) at the source of p-channel pull-up transistor 24 prohibits complete deactivation.

Referring again to FIG. 4, the driver circuit 44 also provides a non-conducting (logic "0") electric signal to the n-channel pull-up circuit 38 that activates n-channel transistor 64 and deactivates p-channel transistor 66. As such, n-channel transistor 64 operates quickly to electrically connect the n-channel pull-up line (NUG) 32 to the ground connection 26. N-channel pull-up transistor 22, illustrated in FIG. 2, is thereby deactivated by the second output signal that is non-conducting on the n-channel pull-up line (NUG) 32. Deactivation of n-channel pull-up transistor 22 stops the supply of the external supply voltage (VccQ) to the data output line (IO) 28.

When data is again read out of the flash memory 10 that is a logic high state, the data signal and the enable signal will conduct at a voltage level that is approximately equal to the supply voltage (Vcc). As such, the output buffer circuit 16 directs the output buffer driver circuit 18 to generate the data output signal at a voltage level of the external supply voltage (VccQ). Referring again to FIG. 4, within the pull-down circuit 36, p-channel transistor 58 is deactivated and n-channel transistor 56 is activated such that the pull-down line (PDG) 30 is quickly lowered to about zero volts. N-channel pull-down transistor 20, illustrated in FIG. 2, is thereby deactivated and the data output line (IO) 28 is no longer electrically connected to the ground connection.

The p-channel pull-up circuit 40 is also activated by the enable and data signals to deactivate p-channel transistor 76 and activate n-channel transistor 74. The voltage level of the feedback signal on the first node (G1) 78 is lowered to about zero volts. P-channel transistor 88 is thereby activated to raise the voltage level of the second node (G2) 80 to be about equal with the external supply voltage (VccQ). When the second node (G2) 80 is about equal to the externally supply voltage (VccQ), p-channel transistor 90 is deactivated completely. In addition, n-channel transistor 94 is deactivated and n-channel transistor 92 is activated by the conducting enable and data signals. Activation of n-channel transistor 92 slowly dissipates the voltage present on the p-channel pull-up line (PUG) 34 to about zero volts, as previously set forth. As such, p-channel pull-up transistor 24, illustrated in FIG. 2, is activated to control the current supplied to the data output line (IO) 28 by controlled electrical connection with the external supply voltage (VccQ) line 27.

Similarly, p-channel transistor 66 in the n-channel pull-up circuit 38 is activated to slowly raise the voltage level of the second output signal, as previously set forth, to the supply voltage (Vcc). Accordingly, n-channel pull-up transistor 22, illustrated in FIG. 2, is activated to control the current supplied to the data output line (IO) 28 by controlled electrical connection to the external supply voltage (VccQ) line 27.

The illustrated embodiment allows the flash memory 10 to generate data output signals from the output buffer driver circuit 18 with an external supply voltage (VccQ) that is greater than the supply voltage (Vcc). The output buffer driver circuit 18 is controlled with output signals from the output buffer circuit 16. The output buffer circuit 16 is operated with both the supply voltage (Vcc) and the external supply voltage (VccQ) to generate the output signals. The output buffer circuit 16 controls the operation of n-channel pull-down transistor 20, n-channel pull-up transistor 22 and p-channel pull-up transistor 24 using the external supply voltage (VccQ) and the supply voltage (Vcc). Since p-channel pull-up transistor 24 is controlled with an output signal that is generated by the output buffer circuit 16 with the external supply voltage (VccQ), p-channel pull-up transistor 24 can be completely deactivated.

The presently preferred embodiments are illustratively set forth with respect to controlling the output buffer driver circuit 18 with the output buffer circuit 16. The present invention can generally be applied to logic circuits that operate with external supply voltages. Therefore, the presently preferred embodiments should not be construed as a limitation on the present invention. In addition, although the illustrated embodiment of the invention uses a supply voltage (Vcc) that is nominally 3.0 V, those skilled in the art would recognize that other supply voltage levels may be used. While the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An output buffer circuit in a memory device for controlling generation of an output signal using an external supply voltage (VccQ) comprising:

an activation circuit that is supplied said external supply voltage (VccQ) for generating a feedback signal in response to electric signals; and a driver circuit electrically connected with said activation circuit that is supplied said external supply voltage (VccQ) and is responsive to said feedback signal and said electric signals to generate said output signal.

2. The output buffer circuit of claim 1, wherein said feedback signal, when conducting, is about equal to said external supply voltage (VccQ).

3. The output buffer circuit of claim 1, wherein said output signal, when conducting, is about equal to said external supply voltage (VccQ).

4. The output buffer circuit of claim 1, wherein said electric signals are generated by said memory device with a supply voltage (Vcc) and include an enable signal and a data signal.

5. The output buffer circuit of claim 1, wherein said memory device is a flash memory.

6. The output buffer circuit of claim 1, wherein said activation circuit includes an inverter.

7. The output buffer circuit of claim 1, wherein said driver circuit includes a level shifter.

8. A memory device capable of controlling generation of a data output signal with an external supply voltage (VccQ), said memory device, comprising:

a) an output buffer circuit comprising:

a p-channel pull-up circuit that includes an activation circuit electrically connected with said external supply voltage (VccQ) for generating a feedback signal in response to electric signals, and a driver circuit electrically connected with said activation circuit and said external supply voltage (VccQ), wherein said driver circuit is responsive to said electric signals and said feedback signal to generate a third output signal;

an n-channel pull-up circuit electrically connected with said p-channel pull-up circuit for generating a second output signal when directed by said p-channel pull-up circuit; and a pull-down circuit for generating a first output signal in response to said electric signals;

b) an output buffer driver circuit electrically connected with said output buffer circuit and said external supply voltage (VccQ) for generating said data output signal in response to said output buffer circuit.

9. The memory device of claim 8, wherein said output buffer driver circuit is electrically connected with said n-channel pull-up circuit, said p-channel pull-up circuit and said pull-down circuit and is responsive to said second output signal, said first output signal and said third output signal to generate said data output signal.

10. The memory device of claim 8, wherein said electric signals are generated by said memory device with a supply voltage (Vcc) and include an enable signal and a data signal.

11. The memory device of claim 8, wherein said third output signal, when conducting, is about equal to said external supply voltage (VccQ).

12. The memory device of claim 8, wherein said second output signal, when conducting, is about equal to a supply voltage (Vcc).

13. The memory device of claim 8, wherein said first output signal, when conducting, is about equal to a supply voltage (Vcc).

14. The memory device of claim 8, wherein said activation circuit generates said feedback signal with a supply voltage (Vcc) and said external supply voltage (VccQ).

15. The memory device of claim 8, wherein said memory device is a flash memory.

16. A method of controlling generation of an output signal with an external supply voltage (VccQ) using a voltage buffer circuit in a memory device, comprising the acts of:

providing a supply voltage (Vcc);

generating electric signals with said memory device using said supply voltage (Vcc);

generating a feedback signal with said voltage buffer circuit using said external supply voltage (VccQ) in response to said electric signals; and generating said output signal with said voltage buffer circuit using said external supply voltage (VccQ) in response to said feedback signal and said electric signals.

17. The method of claim 16, comprising the further act of controlling an output buffer driver circuit with said output signal.

18. The method of claim 16, wherein said feedback signal, when conducting, is about equal to said external supply voltage (VccQ).

19. The method of claim 16, wherein said output signal, when conducting, is about equal to said external supply voltage (VccQ).

20. The method of claim 16, wherein said output signal, when non-conducting, is about equal to zero volts.

21. The method of claim 16, wherein said electric signals include an enable signal and a data signal.

22. The method of claim 16, wherein said memory device is a flash memory.

* * * * *